(12) United States Patent
Chen et al.

(10) Patent No.: US 10,349,741 B2
(45) Date of Patent: *Jul. 16, 2019

(54) SLIDE RAIL MECHANISM AND BRACKET DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/626,163

(22) Filed: Jun. 18, 2017

(65) Prior Publication Data

US 2018/0199713 A1    Jul. 19, 2018

(30) Foreign Application Priority Data

Jan. 16, 2017   (TW) .............................. 106101606 A

(51) Int. Cl.
*A47B 88/43*    (2017.01)
*H05K 7/14*    (2006.01)
(Continued)

(52) U.S. Cl.
CPC .............. *A47B 88/43* (2017.01); *A47B 88/49* (2017.01); *H05K 7/1489* (2013.01); *A47B 96/06* (2013.01)

(58) Field of Classification Search
CPC ....... A47B 88/43; A47B 88/49; A47B 88/483; A47B 2088/4235; A47B 96/06;
(Continued)

(56) References Cited

U.S. PATENT DOCUMENTS 8,353,494 B2 *   1/2013   Peng ...................... A47B 88/43
                                                        211/192
9,328,769 B1 *   5/2016   Chen ................... H05K 7/1489
(Continued)

FOREIGN PATENT DOCUMENTS

CN       103945671      1/2017
JP        3182593 U     4/2013

*Primary Examiner* — Christopher Garft
(74) *Attorney, Agent, or Firm* — Winston Hsu

(57) ABSTRACT

A slide rail mechanism includes a rail member, a first supporting frame, a second supporting frame, a bracket and a reinforcing member. The first supporting frame is movable relative to the rail member. The second supporting frame is movable relative to the first supporting member. The bracket and the second supporting frame are movable relative to each other. The reinforcing member is movable relative to the rail member in response to movement of the first supporting frame. Wherein, the rail member includes a first engaging structure, and the reinforcing member includes a second engaging structure. The reinforcing member is configured to be engaged with the first engaging structure through the second engaging structure.

18 Claims, 14 Drawing Sheets

(51) Int. Cl.
*A47B 88/49* (2017.01)
*A47B 96/06* (2006.01)

(58) Field of Classification Search
CPC ..... A47B 88/423; A47B 88/044; A47B 96/07;
A47B 96/061; A47B 96/067; H05K
7/1489; H05K 7/1421
USPC ..................................................... 248/218.4
See application file for complete search history.

(56) References Cited

U.S. PATENT DOCUMENTS

| | | |
|---|---|---|
| 9,629,460 B1 | 4/2017 | Chen |
| 2012/0057812 A1 | 3/2012 | Judge |
| 2014/0217049 A1* | 8/2014 | Chen .................... H05K 7/1489 |
| | | 211/195 |
| 2014/0265788 A1 | 9/2014 | Judge |
| 2015/0201754 A1 | 7/2015 | Chen |

* cited by examiner

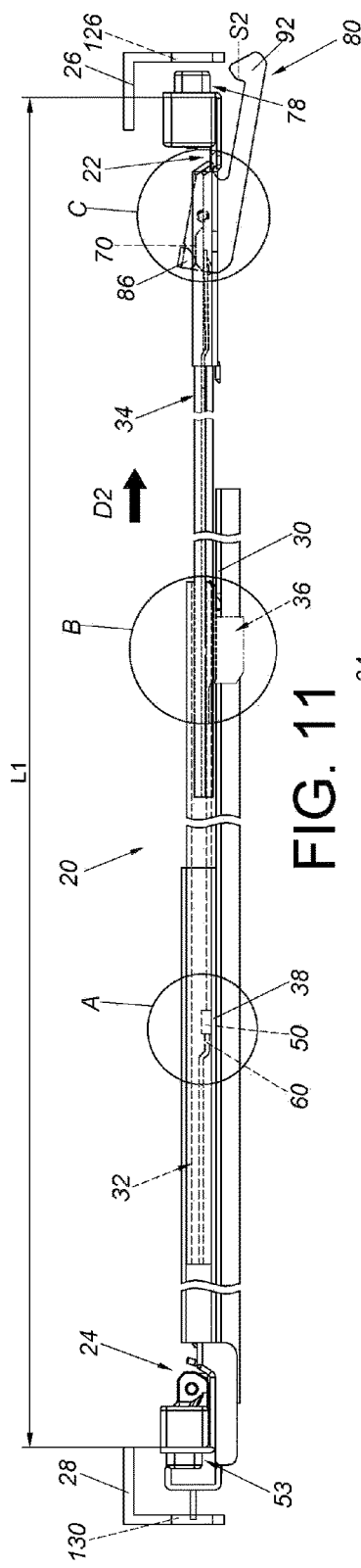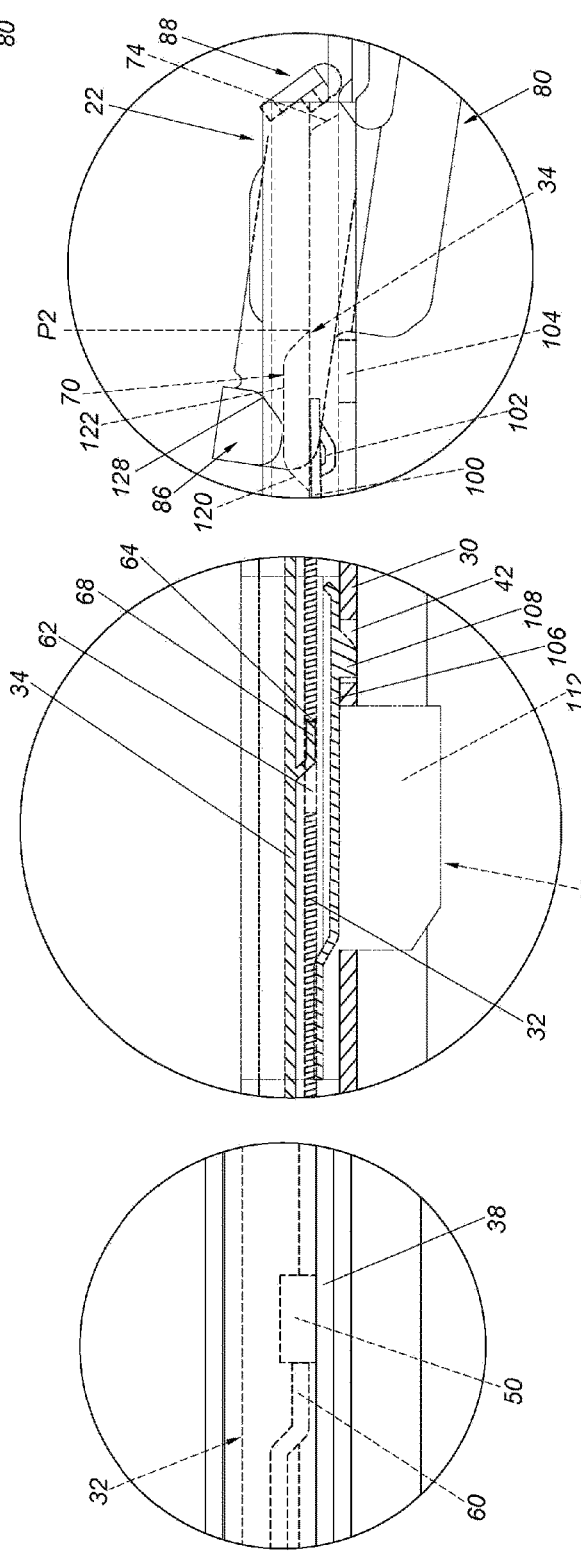

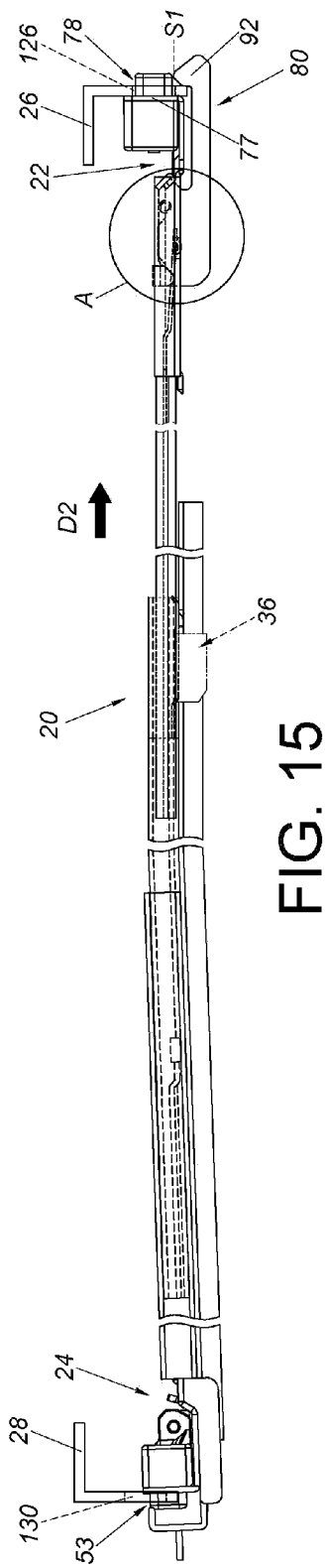
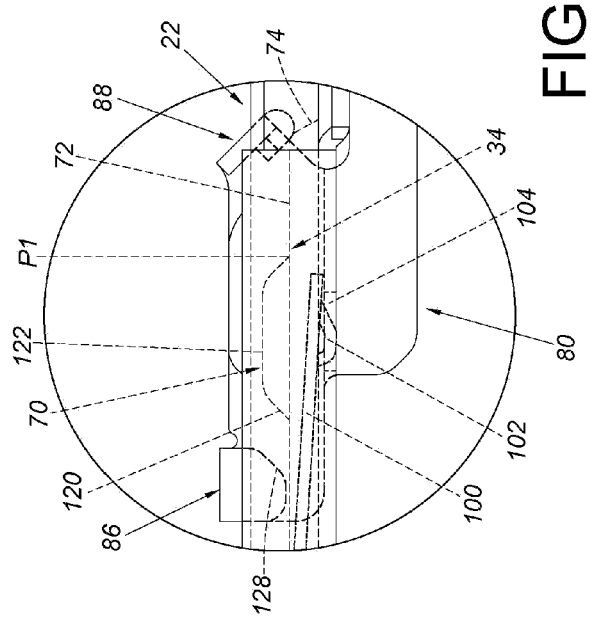

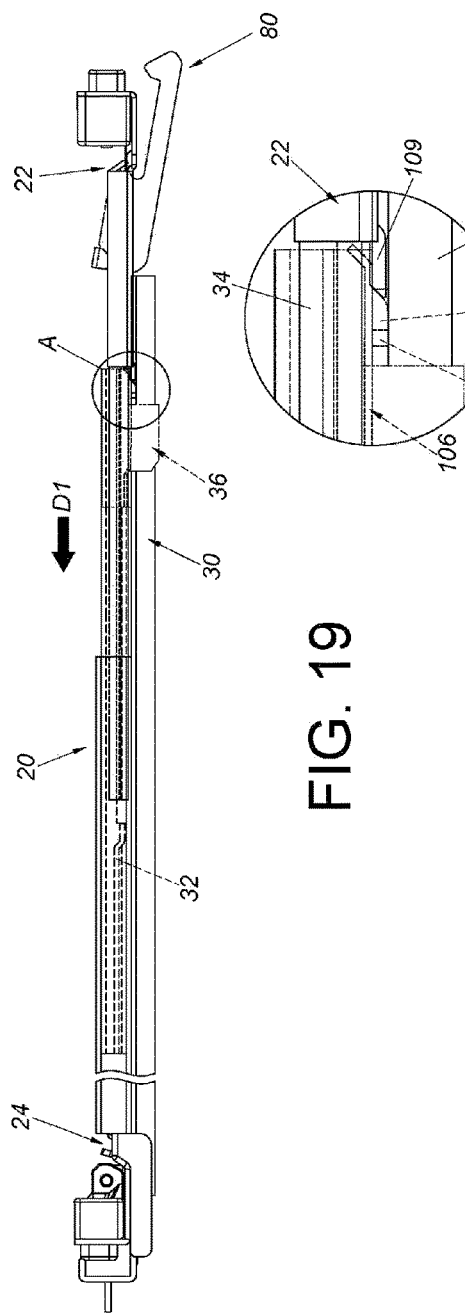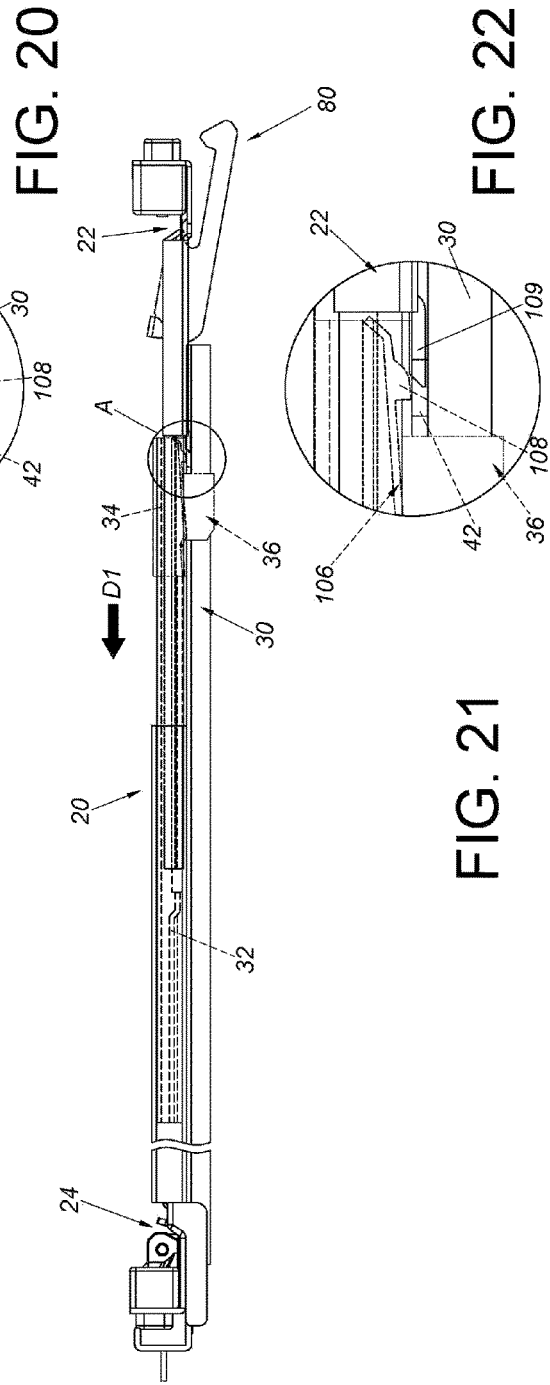

SLIDE RAIL MECHANISM AND BRACKET DEVICE THEREOF

BACKGROUND OF THE INVENTION

1. Field of the Invention

The present invention relates to a slide rail mechanism, and more particularly, to a slide rail mechanism capable of being mounted to a rack through one-man operation, and applicable to racks with different depth.

2. Description of the Prior Art

China patent publication number CN 102695396B discloses a tool-free slide rail mounting frame for server. The tool-free slide rail mounting frame for server comprises a pair of rack positioning columns (4) arranged on a slide rail rear mounting frame (1) and a rack floating hook (2). The rack floating hook (2) comprises a pair of hooks (203) respectively arranged on a pair of wings (205). The wings (205) are respectively provided with slide guiding sleeves (201) and are in fixed connection through an arch-shaped bending member (206). The slide rail rear mounting frame (1) is fixed with two slide guiding columns (101). The slide guiding columns (101) are sleeved in the slide guiding sleeves (201) and are in fixed connection through limit screws (7). First return springs are arranged on the slide guiding sleeves (201) and between the wings (205) and the limit screws (7). The slide rail rear mounting frame (1) is further provided with a floating pin hole for placing a floating pin (3). One end of the floating pin (3) is connected to the arch-shaped bending member (206) through the limit screws (7), and the other end of the floating pin is a conical head (301) arranged in the floating pin hole (104). Second return springs are arranged on the floating pin (3) and between an end face of the conical head (301) and the limit screws (7).

According to the above arrangement, the tool-free slide rail mounting frame for server can be driven by an outer rail covered by a rear frame through the floating pin (3), so as to lock/release the slide rail rear mounting frame (1). However, the design disclosed in the prior art is limited to a length of the outer rail and adjustable degree of a bracket cooperated with the outer rail, such that usage of the tool-free slide rail mounting frame for server is limited accordingly. In other words, the outer rail is required to be long enough to lock/release the rear slide rail mounting frame (1).

On the other hand, as shown FIG. 1, a slide rail mechanism 300 comprises a slide rail 302. The slide rail 302 is configured to be mounted to a front post 308 and a rear post 310 of a rack respectively through a front bracket device 304 and a rear bracket device 306. Wherein, the rear bracket device 306 usually comprises a rear bracket 312 and at least one supporting frame, such as two supporting frames 314, 316 movable relative to each other, such that a traveling distance of the rear bracket 312 relative to the slide rail 302 can be adjusted, in order to mount the slide rail 302 to the front post 308 and the rear post 310 at different distances from each other. Wherein, when the slide rail 302 carries an object 318 and a weight W of the object 318 is overweight, the two supporting frames 314, 316 and the rear bracket 312 of the rear bracket device 306 are pulled down to be relatively lower, so as to cause a problem of the two supporting frames 314, 316 and the rear bracket 312 being tilted relative to each other.

SUMMARY OF THE INVENTION

An objective of the present invention is to provide a slide rail mechanism capable of being mounted to a front post and a rear post of a rack by a single person in front of the rack, and capable of improving support capability of a slide rail.

Another objective of the present invention is to provide a slide rail mechanism capable of being mounted to racks with different depths through one-man operation, and capable of improving support capability of a slide rail.

According to an embodiment of the present invention, a slide rail mechanism comprises a rail member, a first supporting frame, a second supporting frame, a first bracket and a reinforcing member. The first supporting frame is movable relative to the rail member. The second supporting frame is movable relative to the first supporting frame. The first bracket is configured to mount the slide rail mechanism to a post. The first bracket and the second supporting frame are movable relative to each other. The reinforcing member is connected to the first supporting frame. Wherein, the rail member comprises a first engaging structure. The reinforcing member comprises a holding part configured to support the rail member. Wherein, the reinforcing member comprises a second engaging structure. The reinforcing member is configured to be engaged with the first engaging structure through the second engaging structure.

Preferably, when the first supporting frame is moved to a predetermined position relative to the rail member, the second engaging structure of the reinforcing member is engaged with the first engaging structure of the rail member.

Preferably, the first bracket comprises a disengaging structure configured to disengage the second engaging structure of the reinforcing member from the first engaging structure of the rail member.

Preferably, the first supporting frame has an opening and at least one contact wall adjacent to the opening, the second supporting frame comprises an abutting part configured to pass through the opening, the abutting part is smaller than the opening.

Preferably, the first bracket comprises a side wall and at least one mounting member adjacent to the side wall, the slide rail mechanism further comprises a fastening member movably mounted to the first bracket.

Preferably, the fastening member is pivoted to the first bracket, the fastening member comprises a supporting leg, the second supporting frame comprises a supporting structure; wherein when the second supporting frame is located at a position relative to the first bracket, the supporting structure of the second supporting frame does not abut against the supporting leg of the fastening member, such that the fastening member is in a first state relative to the at least one mounting member; wherein when the second supporting frame is moved away from the position, the supporting structure of the second supporting frame abuts against the supporting leg of the fastening member, such that the fastening member is in a second state relative to the at least one mounting member.

Preferably, the slide rail mechanism further comprises an elastic member attached to the second supporting frame, wherein the elastic member comprises a first engaging feature, the first bracket further comprises a second engaging feature, the first engaging feature is configured to be engaged with the second engaging feature.

Preferably, the first engaging feature is a protrusion, the second engaging feature is a positioning hole.

Preferably, when the second supporting frame is located at the position relative to the first bracket, the second supporting frame is engaged with the second engaging feature of the first bracket through the first engaging feature of the elastic member.

Preferably, one of the second supporting frame and the first bracket comprises a limiting structure, the second supporting frame and the first bracket are movable relative to each other within a limited range defined by the limiting structure.

Preferably, the first bracket further comprises an end wall substantially perpendicularly connected to the side wall, the at least one mounting member is arranged on the end wall.

Preferably, the side wall of the first bracket comprises a first wall section and a second wall section, a space is defined between the first wall section and the second wall section, the first bracket and the second supporting frame are movable relative to each other through the space.

Preferably, the second supporting frame further comprises an extension part and a guiding structure, the extension part is located between the supporting structure and the guiding structure, the supporting structure comprises a supporting section and a guiding section adjacent to the supporting section, the fastening member further comprises a guiding leg; when the second supporting frame is located at the position relative to the first bracket, the extension part of the second supporting frame abuts against the guiding leg of the fastening member, such that the fastening member is held in the first state; when the second supporting frame is moved away from the position relative to the first bracket, the guiding section of the supporting structure is configured to drive the supporting leg of the fastening member, such that the fastening member is moved to switch from the first state to the second state; when the fastening member is in the second state, the supporting section of the supporting structure is configured to abut against the supporting leg of the fastening member; in a process of the second supporting frame being moved back to the position relative to the first bracket, the guiding structure of the second supporting frame drives the fastening member to switch from the second state to the first state through the guiding leg.

Preferably, the slide rail mechanism further comprises a supporting rail connected to the rail member, wherein the supporting rail comprises a upper wall, a lower wall and a longitudinal wall connected between the upper wall and the lower wall, a passage is defined by the upper wall, the lower wall and the longitudinal wall, at least one portion of the first supporting frame is movably mounted within the passage.

Preferably, the longitudinal wall of the supporting rail has a first limiting feature located within the passage, the first supporting frame has a second limiting feature corresponding to the first limiting feature.

Preferably, the slide rail mechanism further comprises a second bracket having a side wall and at least one mounting member adjacent to the side wall, the side wall is connected to the longitudinal wall of the supporting rail.

According to another embodiment of the present invention, a slide rail mechanism comprises a rail member, a first supporting frame, a second supporting frame, a bracket and a reinforcing member. The first supporting frame is movable relative to the rail member. The second supporting frame is movable relative to the first supporting member. The bracket configured to mount the slide rail mechanism to a post. The bracket and the second supporting frame are movable relative to each other. The reinforcing member is fixedly connected to the first supporting frame to be movable relative to the rail member in response to movement of the first supporting frame. Wherein, the rail member comprises a first engaging structure. The reinforcing member comprises a second engaging structure. The reinforcing member is configured to be engaged with the first engaging structure through the second engaging structure.

According to yet another embodiment of the present invention, a bracket device of a slide rail mechanism comprises an auxiliary and a bracket mounted to the auxiliary supporting frame. Wherein, one of the auxiliary supporting frame and the bracket comprises a first wall section and a second wall section. A space is defined between the first wall section and the second wall section. The bracket and the auxiliary supporting frame are movable relative to each other through the space. Wherein, the bracket comprises a first supporting protrusion located at one of an upper side and a lower side of the space for supporting the second supporting frame. Wherein, the auxiliary supporting frame comprises a front supporting protrusion located at the other one of the upper side and the lower side of the space for supporting the bracket.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 11 is a diagram showing the slide rail mechanism being moved toward the first post to be mounted to the first post through the first bracket according to an embodiment of the present invention.

FIG. 12 is an enlarged view of an area A of FIG. 11.

FIG. 13 is an enlarged view of an area B of FIG. 11.

FIG. 14 is an enlarged view of an area C of FIG. 11.

FIG. 15 is a diagram showing the first bracket of the slide rail mechanism being mounted to the first post according to an embodiment of the present invention.

FIG. 16 is an enlarged view of an area A of FIG. 15.

FIG. 19 is a diagram showing the first bracket contacting a reinforcing member during a process of the slide rail mechanism being switched from the extended state to a retracted state according to an embodiment of the present invention.

FIG. 20 is an enlarged view of an area A of FIG. 19.

FIG. 21 is a diagram showing the first bracket configured to disengage the reinforcing member from a rail member during a process of the slide rail mechanism being switched from the extended state to the retracted state according to an embodiment of the present invention.

FIG. 22 is an enlarged view of an area A of FIG. 21.

DETAILED DESCRIPTION

Figure 2:
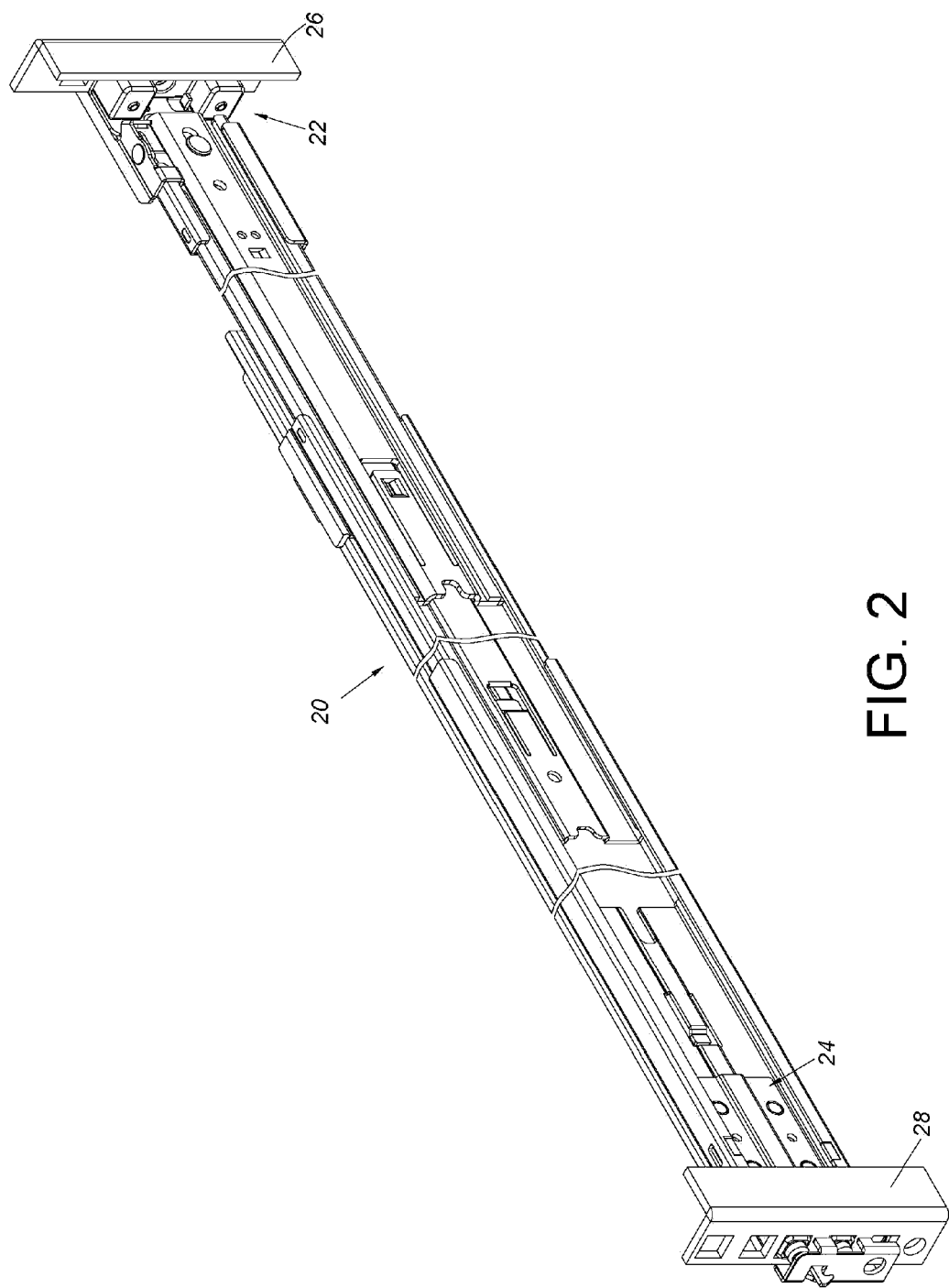
FIG. 2 is a diagram showing a slide rail mechanism being mounted to a first post and a second post of a rack according to an embodiment of the present invention.

As shown in FIG. 2, a slide rail mechanism 20 of an embodiment of the present invention is configured to be mounted to a first post 26 and a second post 28 of a rack respectively through a first bracket 22 and a second bracket 24.

Figure 3:
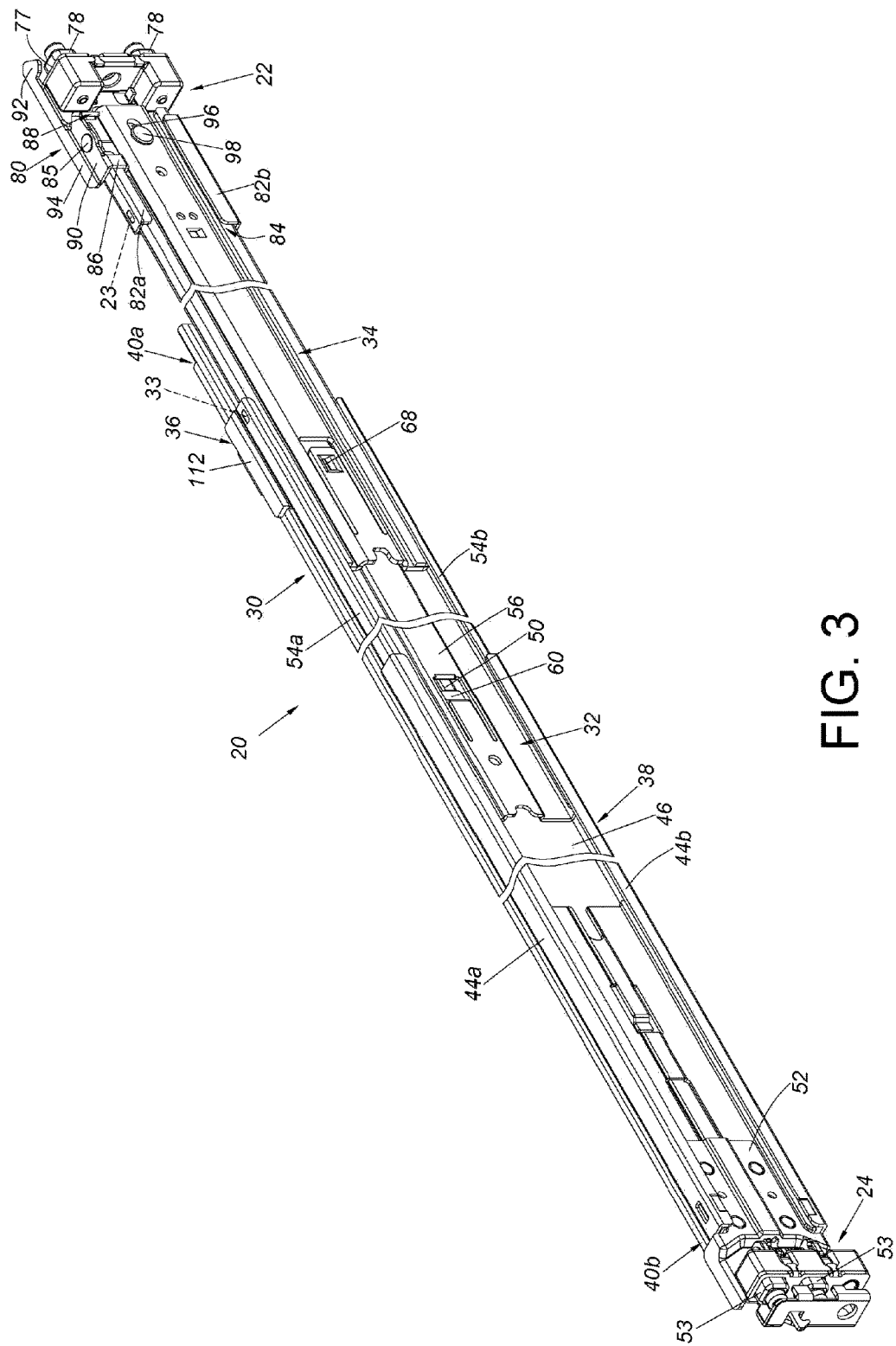
FIG. 3 is a diagram showing the slide rail mechanism according to an embodiment of the present invention.
Figure 4:
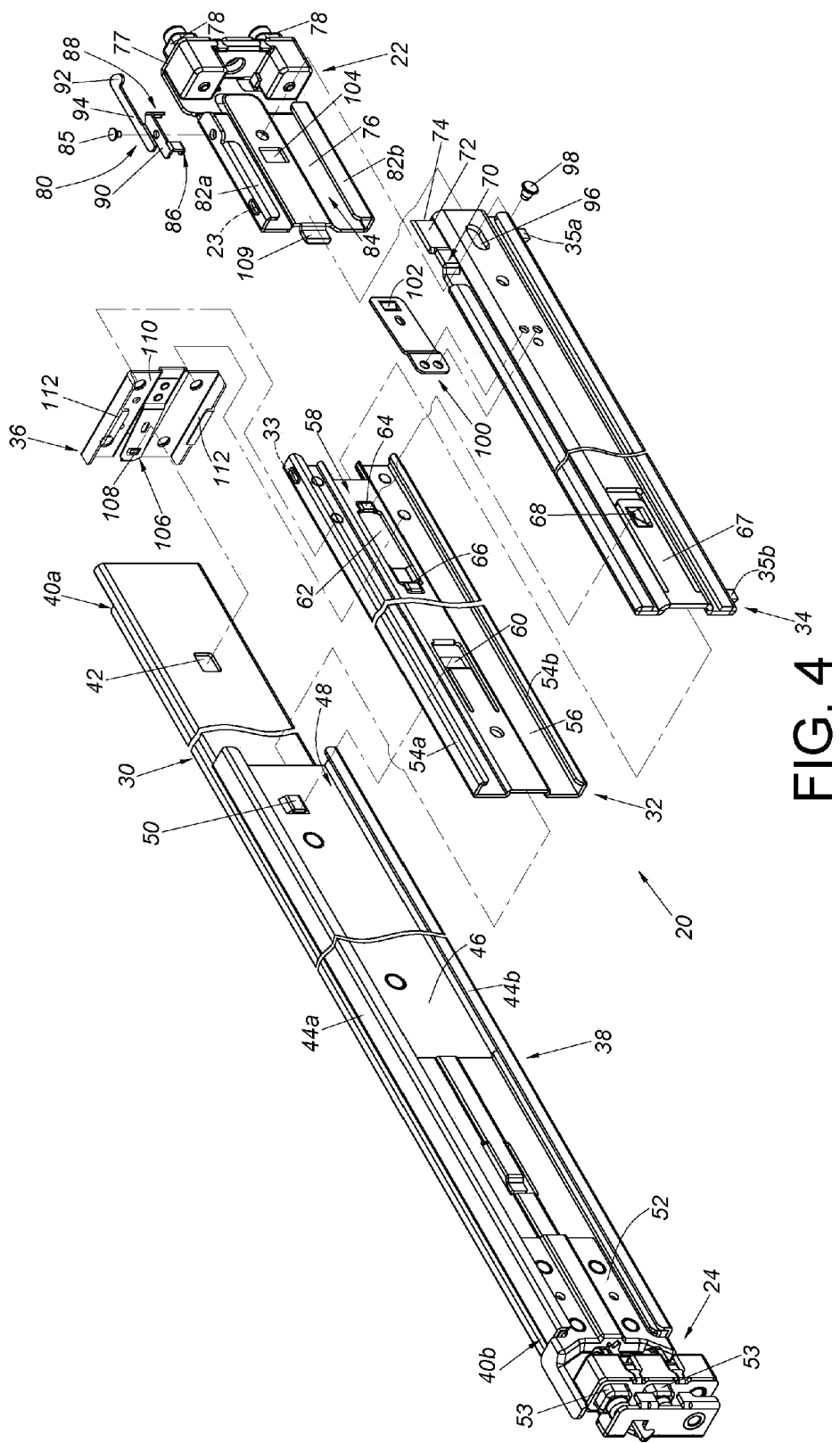
FIG. 4 is an exploded view of the slide rail mechanism according to an embodiment of the present invention.

As shown in FIG. 3 and FIG. 4, the slide rail mechanism 20 comprises a rail member 30, a first supporting frame 32 (or called as extension supporting frame), a second supporting frame 34 (or called as auxiliary supporting frame), the first bracket 22 and a reinforcing member 36. Preferably, the slide rail mechanism 20 further comprises a supporting rail 38 and the second bracket 24.

The rail member 30 has a first end part 40a and a second end part 40b located opposite to the first end part 40a. The rail member 30 further comprises a first engaging structure 42 located between the first end part 40a and the second end part 40b.

The supporting rail 38 is connected, such as fixedly connected, to a back side of the rail member 30, such that the supporting rail 38 can be seen as a portion of the rail member 30. For example, the supporting rail 38 can be connected to the rail member 30 by riveting, screwing or welding. Moreover, the supporting rail 38 has an upper wall 44a, a lower wall 44b and a longitudinal wall 46 connected between the upper wall 44a and the lower wall 44b. A passage 48 is defined by the upper wall 44a, the lower wall 44b and the longitudinal wall 46. Preferably, the longitudinal wall 46 has a first limiting feature 50 located within the passage 48. In the present embodiment, the first limiting feature 50 is a protrusion. The second bracket 24 has a side wall 52 and at least one mounting member 53 located adjacent to an end of the side wall 52. The side wall 52 is connected to the longitudinal wall 46 of the supporting rail 38. In the present embodiment, the second bracket 24 has two mounting members 53. Preferably, the second bracket 24 is located adjacent to the second end part 40b of the rail member 30.

The first supporting frame 32 is movable relative to the rail member 30. For example, a portion of the first supporting frame 32 is movably mounted within the passage 48 of the supporting rail 38. The first supporting frame 32 is movable relative to the rail member 30 through the passage 48 of the supporting rail 38, but the present invention is not limited thereto. The first supporting frame 32 has an upper supporting wall 54a, a lower supporting wall 54b and a longitudinal wall 56 connected between the upper supporting wall 54a and the lower supporting wall 54b. A passage 58 is defined by the upper supporting wall 54a, the lower supporting wall 54b and the longitudinal wall 56. Moreover, the first supporting frame 32 has a second limiting feature 60. The second limiting feature 60 is connected to the longitudinal wall 56 of the first supporting frame 32, and located at a position corresponding to the first limiting feature 50 of the supporting rail 38. In the present embodiment, the second limiting feature 60 is an extension arm. Preferably, the first supporting frame 32 further has an opening 62 and a contact wall 64 adjacent to the opening 62. Wherein, the opening 62 is longitudinally arranged. Preferably, the first supporting frame 32 further has a guiding face 66 (such as an inclined face or a curved face). The contact wall 64 and the guiding face 66 are respectively located at two sides of the opening 62.

The second supporting frame 34 is movable relative to the first supporting frame 32. For example, a portion of the second supporting frame 34 is movably mounted within the passage 58 of the first supporting frame 32. The second supporting frame 34 is movable relative to the first supporting frame 32 through the passage 58 of the first supporting frame 32, but the present invention is not limited thereto. The second supporting frame 34 comprises an elastic arm 67 and an abutting part 68 arranged to the elastic arm 67. Wherein, the elastic arm 67 is extended from the second supporting frame 34. The abutting part 68 is configured to pass through the opening 62 of the first supporting frame 32. The abutting part 68 is smaller than the opening 62. Preferably, the second supporting frame 34 further comprises a supporting structure 70, an extension part 72 and a guiding structure 74. The extension part 72 is located between the supporting structure 70 and the guiding structure 74.

The first bracket 22 and the second supporting frame 34 are movable relative to each other. Preferably, the first bracket 22 is movably mounted to the second supporting frame 34 and is adjustable to be adjacent to the first end part 40a of the rail member 30. Wherein, the first bracket 22 comprises a side wall 76, an end wall 77 and at least one mounting member 78. The end wall 77 is substantially perpendicularly connected to the side wall 76. The at least one mounting member 78 is arranged on the end wall 77. In the present embodiment, the second bracket 24 has two mounting members 78. The slide rail mechanism 20 further comprises a fastening member 80 movably mounted to the first bracket 22. Wherein, the first bracket 22 and the second supporting frame 34 (and the first supporting frame 32) can be seen as a bracket device.

Moreover, one of the first bracket 22 and the second supporting frame 34 is arranged with a first wall section and a second wall section to define a space there between. In the present embodiment, an upper portion and a lower portion of the side wall 76 of the first bracket 22 are respectively arranged with a first wall section 82a and a second wall section 82b, and a space 84 is defined between the first wall section 82a and the second wall section 82b. The first bracket 22 and the second supporting frame 34 are movable relative to each other through the space 84. Preferably, the fastening member 80 is pivoted to the first bracket 22 through a shaft 85. For example, the fastening member 80 is pivoted to the first wall section 82a. The fastening member 80 comprises a supporting leg 86 and a guiding leg 88. Preferably, the fastening member 80 further comprises a mounting part 90, a fastening part 92 and an arm part 94 located between the mounting part 90 and the fastening part 92. In the present embodiment, the supporting leg 86 and the guiding leg 88 are spaced from each other. Wherein, the supporting leg 86 and the guiding leg 88 are bent relative to the mounting part 90, and the supporting leg 86 and the guiding leg 88 are adjacent to the space 84 of the first bracket 22.

Preferably, one of the first bracket 22 and the second supporting frame 34 further comprises a limiting structure 96. The first bracket 22 and the second supporting frame 34 are movable relative to each other within a limited range defined by the limiting structure 96. In the present embodiment, the limiting structure 96 can be a bounded elongated hole, and the slide rail mechanism 20 further comprises a connecting member 98 passing through a portion of the limiting structure 96 for connecting the second supporting frame 34 to the first bracket 22.

Preferably, the first bracket 22 further comprises a first supporting protrusion 23 located at one of an upper side and a lower side of the space 84 (such as at the upper side of the space 84), in order to support the second supporting frame 34. The second supporting frame 34 further comprises a front supporting protrusion 35a located at the other one of the upper side and the lower side of the space 84 (such as at the lower side of the space 84), in order to support the second wall section 82b of the first bracket 22 (please also refer to FIG. 24). Preferably, the first supporting frame 32 further comprises a second supporting protrusion 33 located at one of an upper side and a lower side of the passage 58 (such as at the upper side of the passage 58), in order to support the second supporting frame 34. The second supporting frame 34 further comprises a rear supporting protrusion 35b located at the other one of the upper side and the lower side of the passage 58 (such as at the lower side of the passage 58), in order to support the lower supporting wall 54b of the first supporting frame 32.

Preferably, the slide rail mechanism 20 further comprises an elastic member 100 attached to the second supporting frame 34. For example, the elastic member 100 can be connected to the second supporting frame 34 by riveting or screwing. The elastic member 100 has a first engaging feature 102. On the other hand, the first bracket 22 further comprises a second engaging feature 104. The first engaging feature 102 is configured to be engaged with the second engaging feature 104. Wherein, the first engaging feature 102 and the second engaging feature 104 can respectively be a convex structure and a concave structure (or a hole), or the first engaging feature 102 and the second engaging feature 104 can respectively be a concave structure (or a hole) and a convex structure. In the present embodiment, the first engaging feature 102 is a protrusion, and the second engaging feature 104 is a positioning hole, but the present invention is not limited thereto.

The reinforcing member 36 is mounted to the rail member 30 and the first supporting frame 32, in order to improve supporting capability between the rail member 30 and the first supporting frame 32. Specifically, the reinforcing member 36 comprises a second engaging structure 106. The reinforcing member 36 is configured to be engaged with the first engaging structure 42 of the rail member 30 through an engaging part of the second engaging structure 106. In the present embodiment, the second engaging structure 106 is an elastic accessory. The second engaging structure 106 can be connected to the reinforcing member 36 by riveting or screwing, such that the second engaging structure 106 can be seen as a portion of the reinforcing member 36. Wherein, the first engaging structure 42 and the second engaging structure 106 can respectively be a concave structure (or a hole) and a convex structure, or the first engaging structure 42 and the second engaging structure 106 can respectively be a convex structure and a concave structure (or a hole), but the present invention is not limited thereto. On the other hand, the first bracket 22 further comprises a disengaging structure 109 configured to disengage the engaging part 108 of the second engaging structure 106 of the reinforcing member 36 from the first engaging structure 42 of the rail member 30.

Preferably, the reinforcing member 36 further comprises a main body part 110 and at least one holding part 112 arranged at a side of the main body part 110. In the present embodiment, the reinforcing member 36 comprises two holding parts 112. The two holding parts 112 are configured to respectively support an upper portion and a lower portion of the rail member 30. The other side of the main body part 110 of the reinforcing member 36 is connected to the first supporting frame 32. For example, the reinforcing member 36 can be fixedly connected to the first supporting frame 32 by riveting, screwing, welding or engaging. Therefore, the first supporting frame 32 and the reinforcing member 36 can be regarded as one component.

Figure 5:
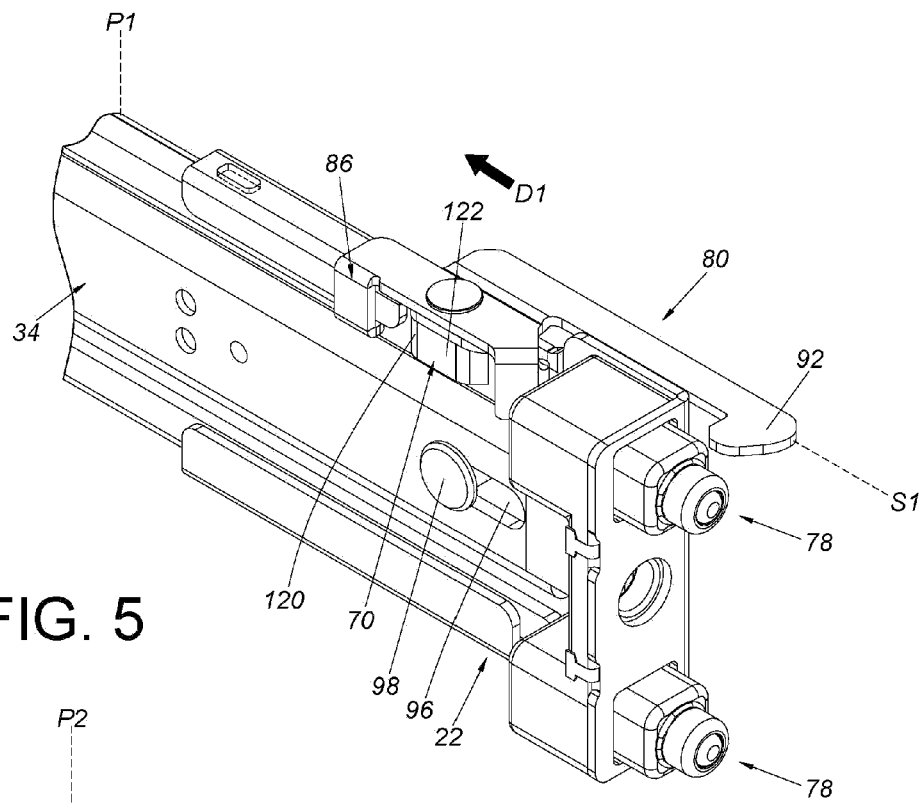
FIG. 5 is a partial view of the slide rail mechanism according to an embodiment of the present invention, wherein a fastening member is in a first state.

As shown in FIG. 5, one of the supporting leg 86 of the fastening member 80 and the supporting structure 70 of the second supporting frame 34 further comprises at least one guiding section. The at least one guiding section has an inclined face or a curved face. In the present embodiment, the supporting structure 70 comprises a first guiding section 120. The supporting structure 70 further comprises a supporting section 122 adjacent to the first guiding section 120. When the second supporting frame 34 is located at a first position P1 relative to the first bracket 22, a predetermined distance is defined between the supporting structure 70 of the second supporting frame 34 and the supporting leg 86 of the fastening member 80. Therefore, the supporting structure 70 of the second supporting frame 34 does not abut against the supporting leg 86 of the fastening member 80, such that the fastening member 80 is in a first state S1 (such as a locking state) relative to the at least one mounting member 78. Specifically, the fastening part 92 of the fastening member 80 is close to the at least one mounting member 78 when the fastening member 80 is in the first state S1.

Figure 6:
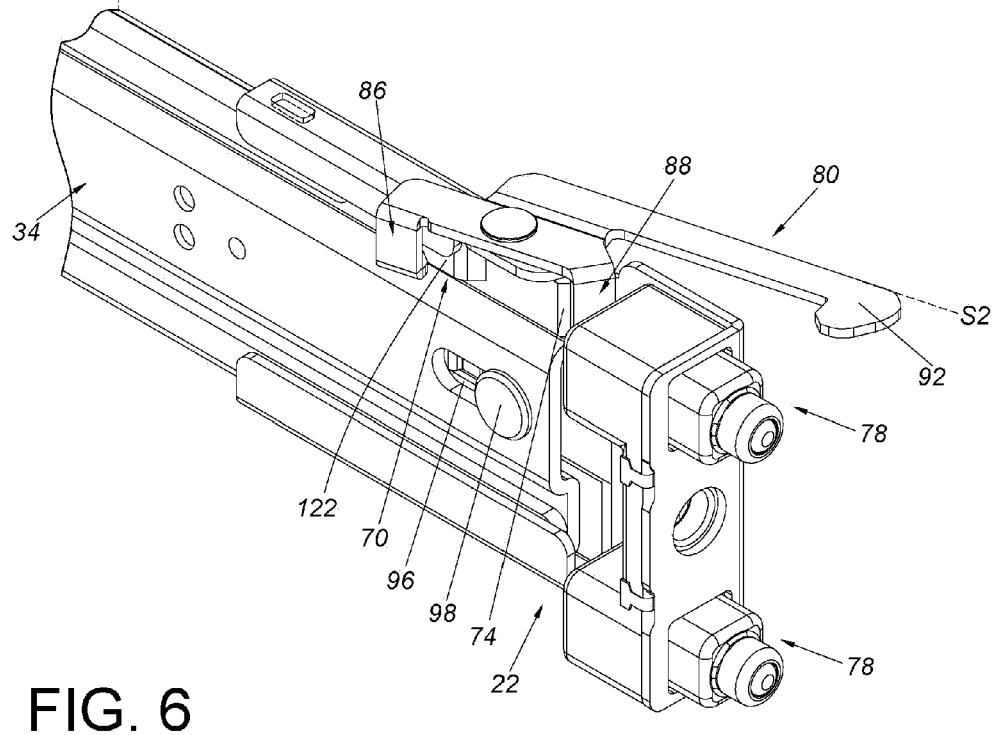
FIG. 6 is a partial view of the slide rail mechanism according to an embodiment of the present invention, wherein the fastening member is in a second state.

As shown in FIG. 6, when the second supporting frame 34 is moved away from the first position P1 relative to the first bracket 22, the supporting structure 70 of the second supporting frame 34 is configured to abut against the supporting leg 86 of the fastening member 80, such that the fastening member 80 is no longer in the first state S1 relative to the at least one mounting member 78. Wherein, the second supporting frame 34 and the first bracket 22 are movable relative to each other within the limited range according to arrangement of the limiting structure 96 and the connecting member 98.

Specifically, in a process of the second supporting frame 34 being moved relative to the first bracket 22 from the first position P1 to a second position P2 along a first direction D1, the supporting structure 70 of the second supporting frame 34 connects the supporting leg 86 through the first guiding section 120, in order to drive the fastening member 80 to rotate. When the second supporting frame 34 is located at the second position P2, the supporting structure 70 of the second supporting frame 34 abuts against the supporting leg 86 of the fastening member 80, such that the fastening member 80 is switched from the first state S1 to a second state S2 (such as an unlocking state) relative to the at least one mounting member 78. The fastening member 80 is held in the second state S2 in response to the supporting structure 70 of the second supporting frame 34 abutting against the supporting leg 86. On the other hand, when the second supporting frame 34 is located at the second position P2 relative to the first bracket 22, the guiding structure 74 of the second supporting frame 34 is located at a position corresponding to the guiding leg 88 of the fastening member 80. Specifically, one of the guiding structure 74 of the second supporting frame 34 and the guiding leg 88 of the fastening member 80 has an inclined face or a curved face. In addition, when the second supporting frame 34 is moved relative to the first bracket 22 from the first position P1 to the second position P2, the fastening member 80 is in the second state S2, and the fastening part 92 of the fastening member 80 is away from the at least one mounting member 78.

Figure 7:
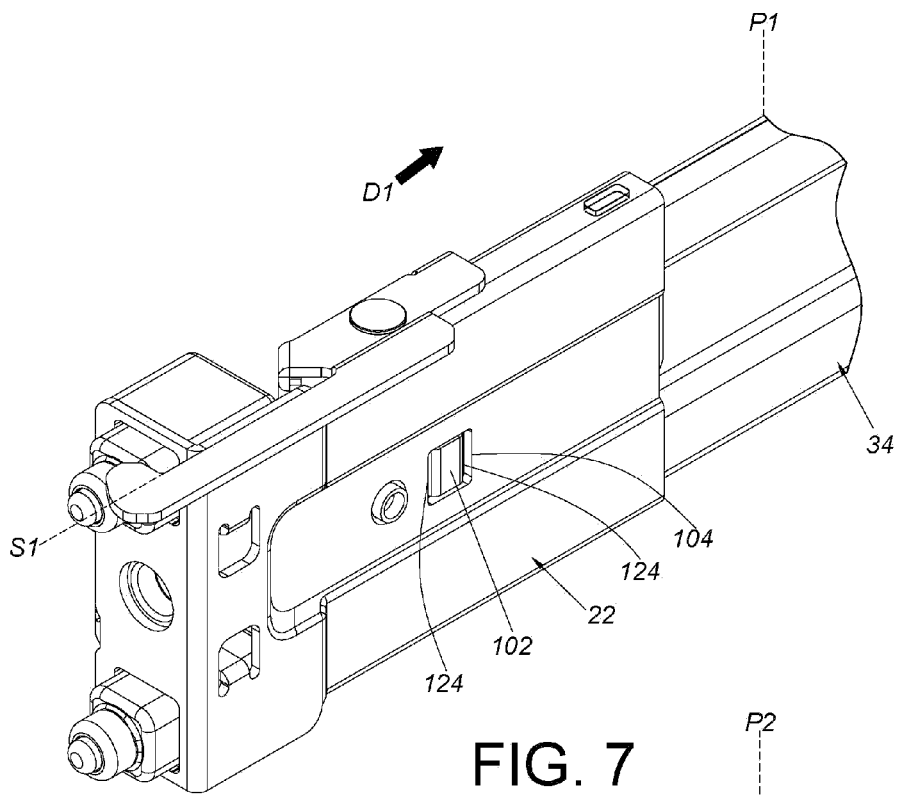
FIG. 7 is a diagram showing a second supporting frame located at a first position relative to a first bracket according to an embodiment of the present invention.

As shown in FIG. 7, when the second supporting frame 34 is located at the first position P1 relative to the first bracket 22, the second supporting frame 34 is engaged with the second engaging feature 104 of the first bracket 22 through the first engaging feature 102 of the elastic member 100, and the first engaging feature 102 corresponds to a blocking wall 124 of the second engaging feature 104. As such, the second supporting frame 34 can be held at the first position P1 relative to the first bracket 22.

Figure 8:
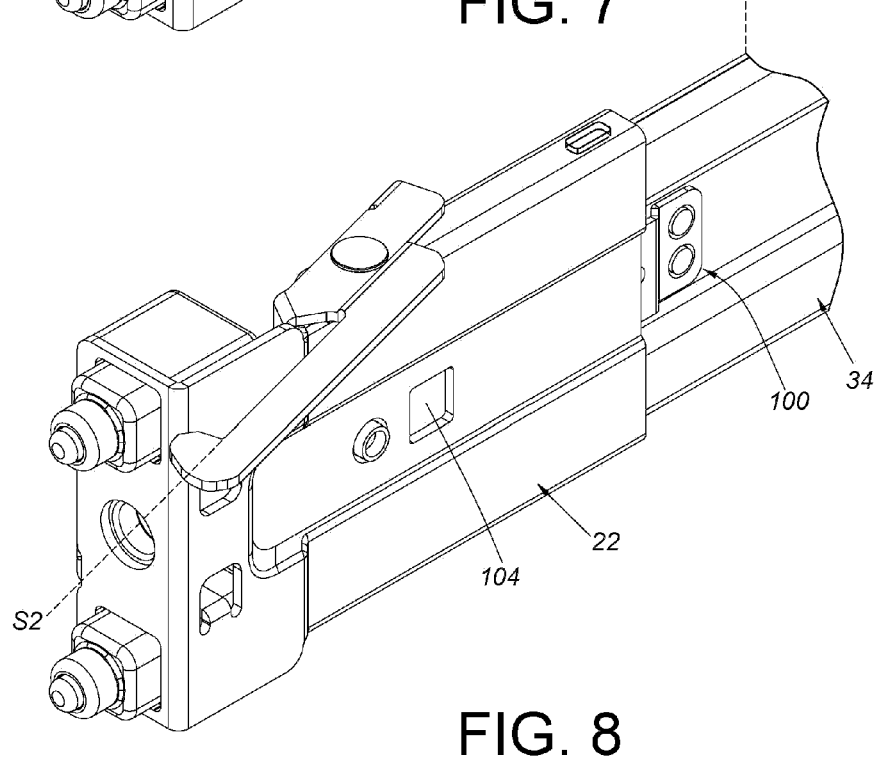
FIG. 8 is a diagram showing the second supporting frame located at a second position relative to the first bracket according to an embodiment of the present invention.

As shown in FIG. 8, the first engaging feature 102 of the elastic member 100 can be directly operated to disengage from the second engaging feature 104 of the first bracket 22, such that the second supporting frame 34 can be further moved relative to the first bracket 22 along the first direction D1 from the first position P1 to the second position P2. On the other hand, the first engaging feature 102 has a guiding mechanism, such as an inclined face or a curved face, corresponding to the second engaging feature 104, such that the first engaging feature 102 can be disengaged from the second engaging feature 104 by simply moving the second supporting frame 34 relative to the first bracket 22.

Figure 9:
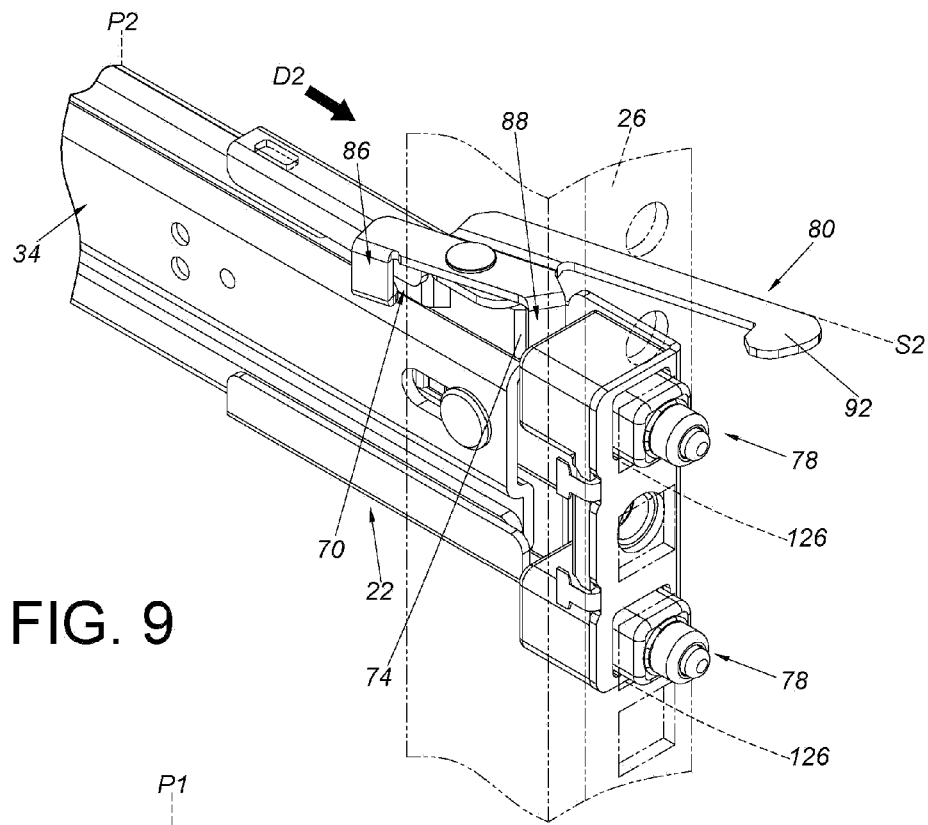
FIG. 9 is a diagram showing at least one mounting member of the first bracket entering a corresponding hole of the first post with the fastening member in the second state.

As shown in FIG. 9, when the second supporting frame 34 is located at the second position P2 relative to the first bracket 22, the supporting structure 70 of the second supporting frame 34 is configured to abut against the supporting leg 86 of the fastening member 80, such that the fastening member 80 is in the second state S2 relative to the first post 26. Wherein, the fastening part 92 of the fastening member 80 is away from the at least one mounting member 78, and the fastening part 92 does not lock the first post 26. More particularly, when the first bracket 22 is going to be mounted to the first post 26, a user can move the first bracket 22 along a second direction D2 (such as a direction opposite to the first direction D1), in order to allow the at least one mounting member 78 of the first bracket 22 to enter a corresponding hole 126 of the first post 26. The first bracket 22 then abuts against the first post 26.

Figure 10:
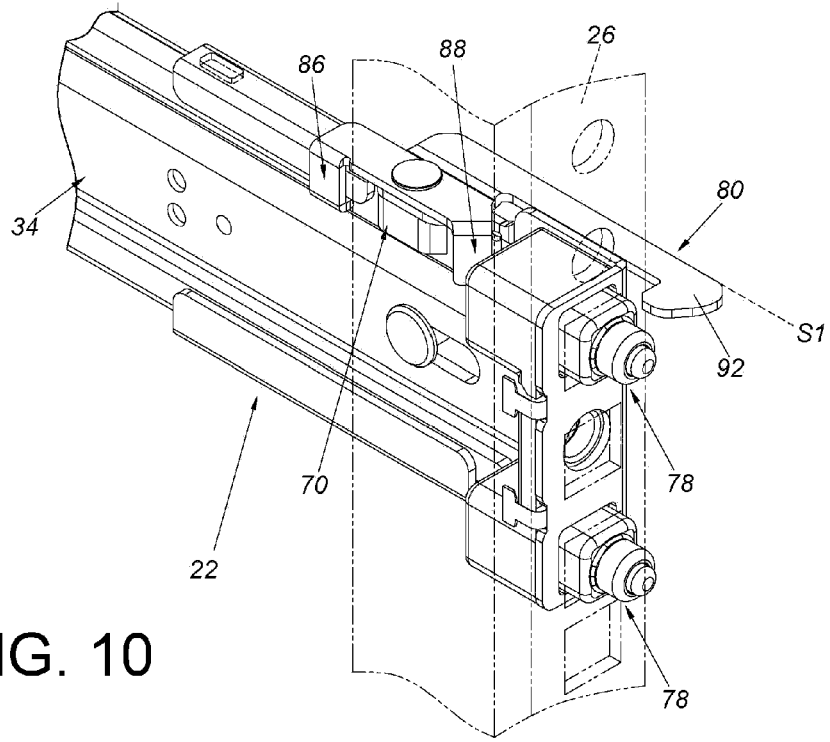
FIG. 10 is a diagram showing the at least one mounting member of the first bracket entering the corresponding hole of the first post with the fastening member in the first state.

As shown in FIG. 10, when the first bracket 22 abuts against the first post 26, the user can further apply a force along the second direction D2, in order to move the second supporting frame 34 relative to the first bracket 22 along the second direction D2 from the second position P2 to the first position P1, such that the supporting structure 70 of the second supporting frame 34 no longer abuts against the supporting leg 86 of the fastening member 80, so as to allow the fastening member 80 to operatively return to the first state S1. Preferably, in response to movement of the second supporting frame 34 relative to the first bracket 22 from the second position P2 along the second direction D2, the guiding structure 74 is configured to drive the guiding leg 88 of the fastening member 80, so as to allow the fastening member 80 to return to the first state S1 from the second state S2. Wherein, the fastening part 92 of the fastening member 80 is close to the at least one mounting member 78, such that the fastening part 92 locks the first post 26. As such, operation of mounting the first bracket 22 to the first post 26 is completed.

As shown in FIG. 11, the user can extend the slide rail mechanism 20 in advance, so as to allow the slide rail mechanism 20 to be in an extended state and have a first length L1. Specifically, the first supporting frame 32 can be moved relative to the rail member 30 along the second direction D2 to be in an extended state relative to the supporting rail 38. The second supporting frame 34 can be moved relative to the first supporting frame 32 along the second direction D2 to be in an extended state relative to the first supporting frame 32.

Wherein, the second limiting feature 60 of the first supporting frame 32 is configured to abut against the first limiting feature 50 of the supporting rail 38 (please also refer to FIG. 12).

Wherein, since the reinforcing member 36 is connected to the first supporting frame 32, the reinforcing member 36 is moved to a predetermined position in response to movement of the first supporting frame 32 relative to the rail member 30 and/or the supporting rail 38 along the second direction D2, such that the reinforcing member 36 is configured to be engaged with the first engaging structure 42 of the rail member 30 through the engaging part 108 of the second engaging structure 106 (please also refer to FIG. 13). As such, the first supporting frame 32 is temporarily fixed relative to the rail member 30 through engagement between the reinforcing member 36 and the rail member 30. Wherein, the second supporting frame 34 can be further moved relative to the first supporting frame 32 along the second direction D2 until the abutting part 68 of the second supporting frame 34 enters the opening 62 of the first supporting frame 32 to abut against the contact wall 64 of the first supporting frame 32 (please also refer to FIG. 13).

Wherein, the supporting section 122 of the supporting structure 70 of the second supporting frame 34 is configured to abut against the supporting leg 86 of the fastening member 80 (please also refer to FIG. 14), such that the fastening member 80 is in the second state S2 relative to the at least one mounting member 78. Wherein, the fastening part 92 of the fastening member 80 is away from the at least one mounting member 78. On the other hand, when the second supporting frame 34 is located at the second position P2 relative to the first bracket 22, the guiding structure 74 of the second supporting frame 34 is located at a position corresponding to (or adjacent to) the guiding leg 88 of fastening member 80. On the other hand, the first engaging feature 102 of the elastic member 100 of the second supporting frame 34 is not yet engaged with the second engaging feature 104 of the first bracket 22.

When the slide rail mechanism 20 is going to be mounted to the first post 26 and the second post 28, the user can move the slide rail mechanism 20 along the second direction D2 first, so as to allow the at least one mounting member 78 of the first bracket 22 to move toward the corresponding hole 126 of the first post 26.

As shown in FIG. 15, after the at least one mounting member 78 of the first bracket 22 of the slide rail mechanism 20 enters the corresponding hole 126 of the first post 26, the first bracket 22 (such as the end wall 77 of the first bracket 22) is configured to abut against the first post 26. Moreover, the user can apply a force along the second direction D2, such as applying a force to the slide rail mechanism 20 along the second direction D2, in order to move the second supporting frame 34 relative to the first bracket 22 from the second position P2 to the first position P1 along the second direction D2. In other words, the supporting section 122 of the supporting structure 70 of the second supporting frame 34 does not abut against the supporting leg 86 of the fastening member 80 (please also refer to FIG. 16), so as to allow the fastening member 80 to operatively return to the first state S1. Wherein, the first engaging feature 102 of the elastic member 100 of the second supporting frame 34 is engaged with the second engaging feature 104 of the first bracket 22. Moreover, in response to movement of the second supporting frame 34 relative to the first bracket 22, the guiding structure 74 drives the guiding leg 88 of the fastening member 80 to move, in order to rotate the fastening member 80 to switch from the second state S2 to the first state S1. Wherein, the fastening part 92 of the fastening member 80 is close to the at least one mounting member 78, such that the fastening part 92 locks the first post 26. Preferably, when the fastening member 80 is in the first state S1, the extension part 72 of the second supporting frame 34 is configured to abut against the guiding leg 88, so as to hold the fastening member 80 in the first state S1. As shown in FIG. 14 and FIG. 16, the supporting leg 86 of the fastening member 80 has a second guiding section 128. Wherein, during a process of moving the second supporting frame 34 relative to the first bracket 22 from the first position P1 to the second position P2 along the first direction (such as the direction opposite to the second direction D2), the fastening member 80 can be easily driven to switch from the first state S1 to the second state S2 by the second supporting frame 34 through the first guiding section 120 or the second guiding section 128.

Figure 17:
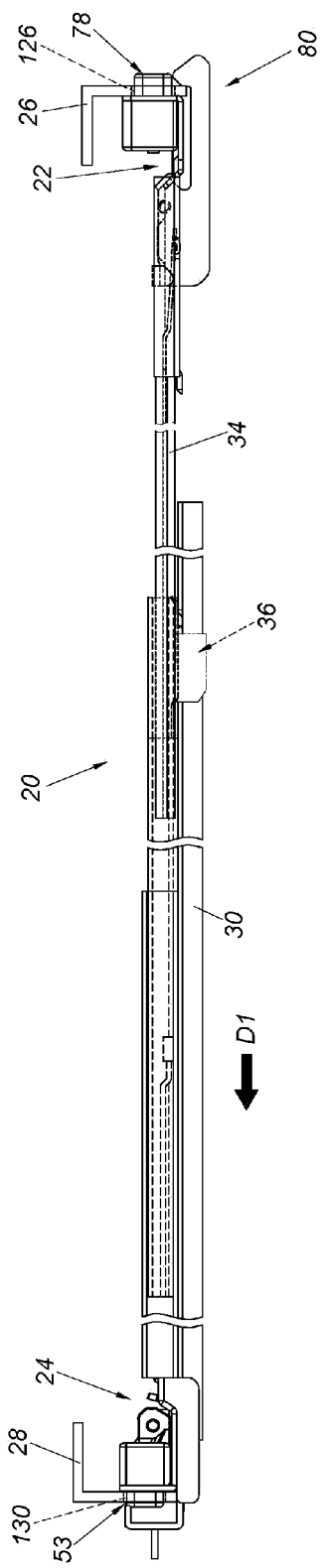
FIG. 17 is a diagram showing the first bracket and the second bracket of the slide rail mechanism being respectively mounted to the first post and the second post according to an embodiment of the present invention.

As shown in FIG. 17, after operation of mounting the first bracket 22 to the first post 26 is completed, the user can operate the rail member 30 to move relative to the second supporting frame 34 along the first direction D1, in order to allow the at least one mounting member 53 of the second bracket 24 to enter a corresponding hole 130 of the second post 28. Such operation is well known to those skilled in the art. For simplification, no further illustration is provided. Therefore, the slide rail mechanism 20 can be mounted to the first post 26 and the second post 28. Furthermore, the first bracket 22 and the second bracket 24 can be respectively detached from the first post 26 and the second post 28 (please refer to FIG. 17, FIG. 15 and FIG. 11, for simplification, no further illustration is provided).

Figure 18:
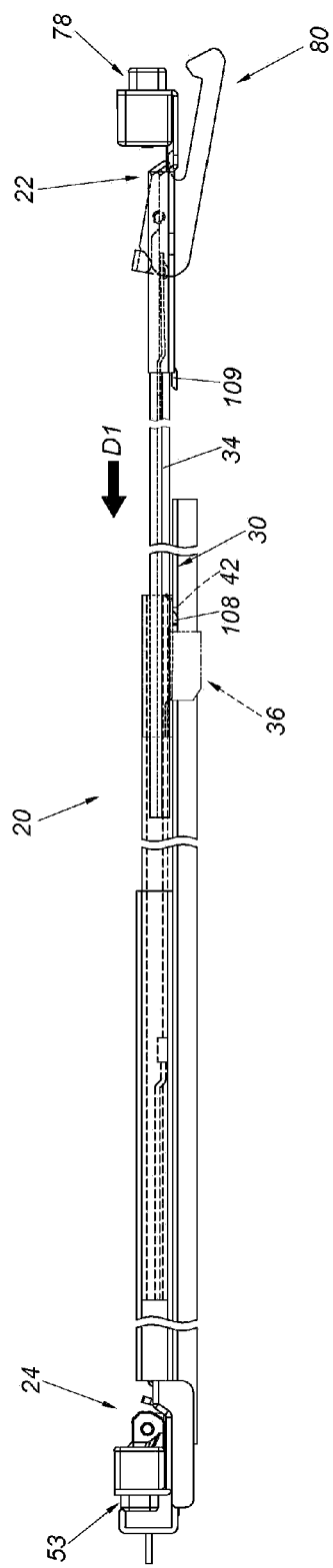
FIG. 18 is a diagram showing the slide rail mechanism being retracted from an extended state along a direction according to an embodiment of the present invention.

As shown in FIG. 18 and FIG. 19, the slide rail mechanism 20 can be operated to switch from the extended state to a retracted state. Specifically, the user can move the second supporting frame 34 along the first direction D1, to allow the disengaging structure 109 of the first bracket 22 to contact the engaging part 108 of the second engaging structure 106 of the reinforcing member 36 (please also refer to FIG. 20).

As shown in FIG. 21 and FIG. 22, when the second supporting frame 34 is further moved along the first direction D1, the disengaging structure 109 of the first bracket 22 can disengage the engaging part 108 of the second engaging structure 106 of the reinforcing member 36 from the first engaging structure 42 of the rail member 30, such that the first supporting frame 32 is movable relative to the rail member 30. Preferably, one of the disengaging structure 109 of the first bracket 22 and the engaging part 108 of the second engaging structure 106 has an inclined face or a curved face configured to assist the disengaging structure 109 in disengaging the engaging part 108 of the second engaging structure 106 of the reinforcing member 36 from the first engaging structure 42 of the rail member 30.

Figure 23:
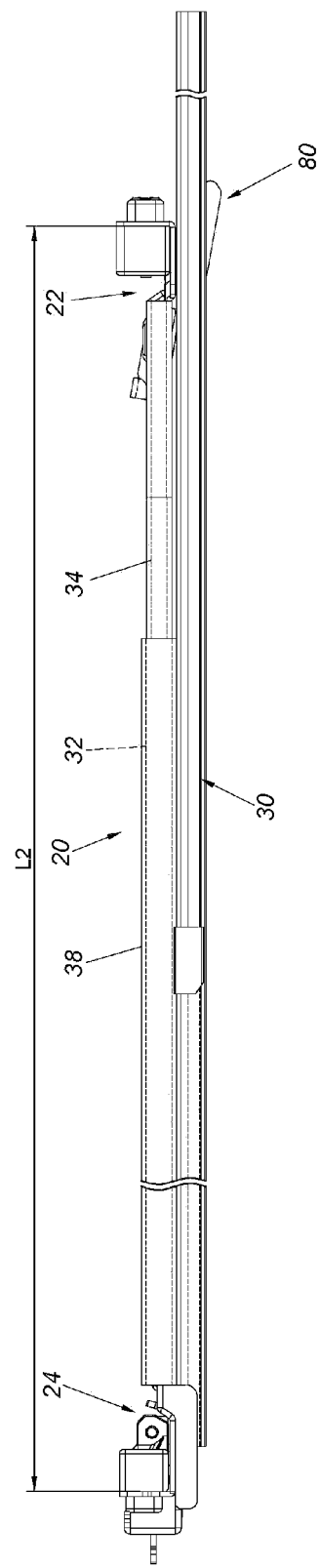
FIG. 23 is a diagram showing the slide rail mechanism in the retracted state according to an embodiment of the present invention.

As shown in FIG. 23, when the first supporting frame 32 is in a state movable relative to the rail member 30, the first bracket 22, the second supporting frame 34 and the first supporting frame can be retracted relative to the rail member 30 and/or the supporting rail 38, so as to allow the slide rail mechanism 20 to be in the retracted state and have a second length L2.

Figure 1:
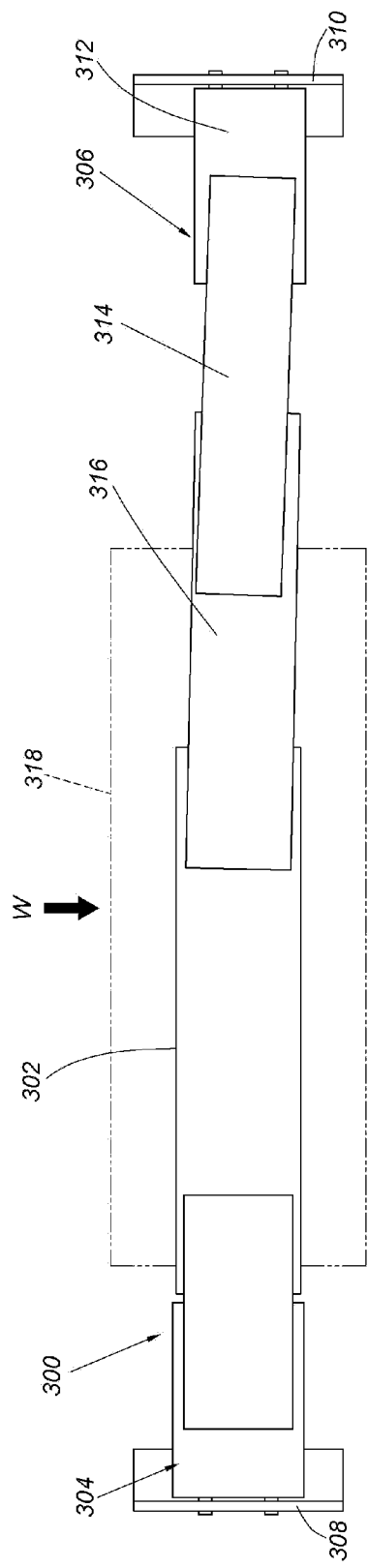
FIG. 1 is a diagram showing a slide rail mechanism of the prior art being mounted to two posts and carrying an object.
Figure 24:
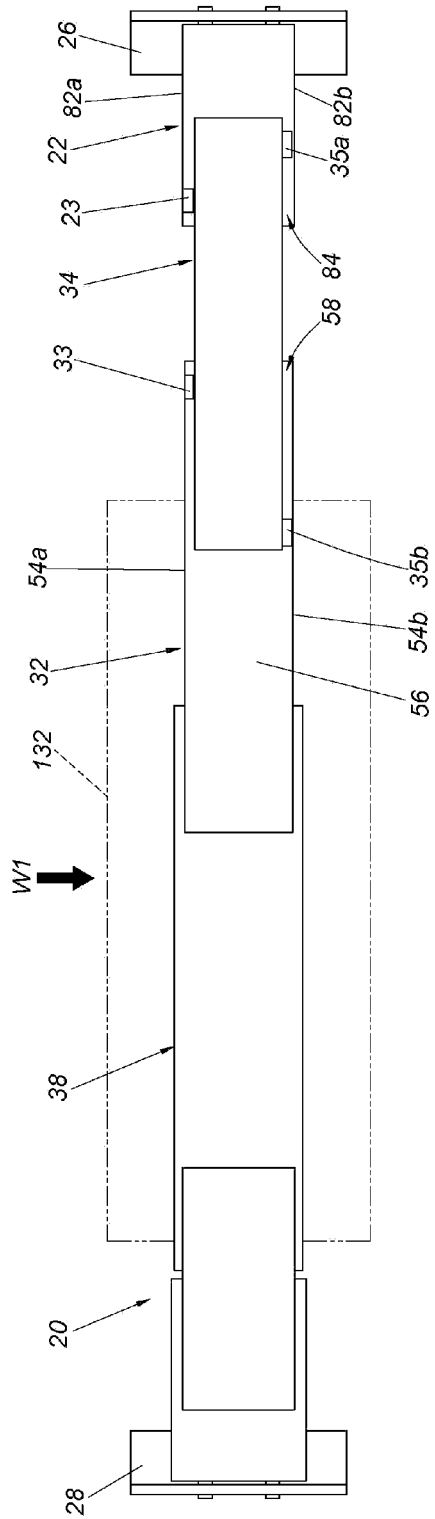
FIG. 24 is a diagram showing the slide rail mechanism being mounted to two posts and carrying an object according to an embodiment of the present invention.

FIG. 24 is a diagram showing the slide rail mechanism 20 mounted to the first post 26 and the second post 28. Specifically, when the rail member 30 (the supporting rail 38 represents the rail member 30 in FIG. 24) carries an object 132 (such as an electronic apparatus or a chassis) and a weight W1 of the object 132 is overweight, supporting strength between the second supporting frame 34 and the first bracket 22 can be improved by the first supporting protrusion 23 and the front supporting protrusion 35a. In addition, supporting strength between the first supporting frame 32 and the second supporting frame 34 can be improved by the second supporting protrusion 33 and the rear supporting protrusion 35b. According to above arrangement, the slide rail and/or the bracket device can be prevented from being pulled down to be relatively lower. In other words, different from the slide rail and/or the bracket device of FIG. 1 having the overweight problem, the arrangement of the first supporting protrusion 23, the second supporting protrusion 33, the front supporting protrusion 35a and the rear supporting protrusion 35b can hold the first bracket 22, the second supporting frame 34 and the first supporting frame 32 to be as horizontal as possible even when the slide rail mechanism is bearing a weight W1 or applied by an external force. Therefore, the problem of the first bracket 22, the second supporting frame 34 and the first supporting frame 32 being tilted relative to each other can be prevented.

Therefore, the slide rail mechanism of the present invention is characterized in that:

1. According to the above arrangement, the slide rail mechanism can be conveniently and quickly mounted to or detached from the two posts of the rack through one-man operation in front of the rack.

2. The first supporting frame can be temporarily engaged with the rail member through the reinforcing member. As such, when the first bracket abuts against the first post and the slide rail mechanism is operated to be moved toward the first post, the second supporting frame can drive the fastening member to switch from the second state to the first state, so as to ensure that the fastening member is switched from the unlocking state to the locking state, in order to lock the post of the rack.

3. The reinforcing member is movable relative to the rail member, and the reinforcing member comprises the holding part configured to support the rail member, so as to improve structure strength of the slide rail mechanism.

4. When the slide rail mechanism is bearing a weight or applied by an external force, the first bracket 22, the second supporting frame 34 and the first supporting frame 32 can be held to be as horizontal as possible through the arrangement of the first supporting protrusion, the second supporting protrusion, the front supporting protrusion and the rear supporting protrusion.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A slide rail mechanism, comprising:
   a rail member;
   a first supporting frame movable relative to the rail member;
   a second supporting frame movable relative to the first supporting frame;
   a first bracket configured to mount the slide rail mechanism to a post, the first bracket and the second supporting frame being movable relative to each other; and
   a reinforcing member connected to the first supporting frame, the reinforcing member comprising a holding part configured to support the rail member;
   wherein the rail member comprises a first engaging structure, the reinforcing member comprises a second engaging structure, the reinforcing member is configured to be engaged with the first engaging structure through the second engaging structure;
   wherein when the first supporting frame is moved to a predetermined position relative to the rail member, the second engaging structure of the reinforcing member is engaged with the first engaging structure of the rail member;
   wherein the first bracket comprises a disengaging structure configured to disengage the second engaging structure of the reinforcing member from the first engaging structure of the rail member.

2. The slide rail mechanism of claim 1, wherein the first supporting frame has an opening and at least one contact wall adjacent to the opening, the second supporting frame comprises an abutting part configured to pass through the opening, the abutting part is smaller than the opening.

3. The slide rail mechanism of claim 1, wherein the first bracket comprises a side wall and at least one mounting member adjacent to the side wall, the slide rail mechanism further comprises a fastening member movably mounted to the first bracket.

4. The slide rail mechanism of claim 3, wherein the fastening member is pivoted to the first bracket, the fastening member comprises a supporting leg, the second supporting frame comprises a supporting structure; wherein when the second supporting frame is located at a position relative to the first bracket, the supporting structure of the second supporting frame does not abut against the supporting leg of the fastening member, such that the fastening member is in a first state relative to the at least one mounting member; wherein when the second supporting frame is moved away from the position, the supporting structure of the second supporting frame abuts against the supporting leg of the fastening member, such that the fastening member is in a second state relative to the at least one mounting member.

5. The slide rail mechanism of claim 4, further comprising an elastic member attached to the second supporting frame, wherein the elastic member comprises a first engaging feature, the first bracket further comprises a second engaging feature, the first engaging feature is configured to be engaged with the second engaging feature.

6. The slide rail mechanism of claim 5, wherein the first engaging feature is a protrusion, the second engaging feature is a positioning hole.

7. The slide rail mechanism of claim 5, wherein when the second supporting frame is located at the position relative to the first bracket, the second supporting frame is engaged with the second engaging feature of the first bracket through the first engaging feature of the elastic member.

8. The slide rail mechanism of claim 4, wherein one of the second supporting frame and the first bracket comprises a limiting structure, the second supporting frame and the first bracket are movable relative to each other within a limited range defined by the limiting structure.

9. The slide rail mechanism of claim 4, wherein the first bracket further comprises an end wall substantially perpendicularly connected to the side wall, the at least one mounting member is arranged on the end wall.

10. The slide rail mechanism of claim 9, wherein the side wall of the first bracket comprises a first wall section and a second wall section, a space is defined between the first wall section and the second wall section, the first bracket and the second supporting frame are movable relative to each other through the space.

11. The slide rail mechanism of claim 4, wherein the second supporting frame further comprises an extension part and a guiding structure, the extension part is located between the supporting structure and the guiding structure, the supporting structure comprises a supporting section and a guiding section adjacent to the supporting section, the fastening member further comprises a guiding leg; when the second supporting frame is located at the position relative to the first bracket, the extension part of the second supporting frame abuts against the guiding leg of the fastening member, such that the fastening member is held in the first state; when the second supporting frame is moved away from the position relative to the first bracket, the guiding section of the supporting structure is configured to drive the supporting leg of the fastening member, such that the fastening member is moved to switch from the first state to the second state; when the fastening member is in the second state, the supporting section of the supporting structure is configured to abut against the supporting leg of the fastening member; in a process of the second supporting frame being moved back to the position relative to the first bracket, the guiding structure of the second supporting frame drives the fastening member to switch from the second state to the first state through the guiding leg.

12. The slide rail mechanism of claim 1, further comprising a supporting rail connected to the rail member, wherein the supporting rail comprises a upper wall, a lower wall and a longitudinal wall connected between the upper wall and the lower wall, a passage is defined by the upper wall, the lower wall and the longitudinal wall, at least one portion of the first supporting frame is movably mounted within the passage.

13. The slide rail mechanism of claim 12, wherein the longitudinal wall of the supporting rail has a first limiting feature located within the passage, the first supporting frame has a second limiting feature corresponding to the first limiting feature.

14. The slide rail mechanism of claim 13, further comprising a second bracket having a side wall and at least one mounting member adjacent to the side wall, the side wall being connected to the longitudinal wall of the supporting rail.

15. A slide rail mechanism, comprising:
    a rail member;
    a first supporting frame movable relative to the rail member;
    a second supporting frame movable relative to the first supporting member;

a bracket configured to mount the slide rail mechanism to a post, the bracket and the second supporting frame being movable relative to each other; and a reinforcing member fixedly connected to the first supporting frame to be movable relative to the rail member in response to movement of the first supporting frame;

wherein the rail member comprises a first engaging structure, the reinforcing member comprises a second engaging structure, the reinforcing member is configured to be engaged with the first engaging structure through the second engaging structure;

wherein when the first supporting frame is moved to a predetermined position relative to the rail member, the second engaging structure of the reinforcing member is engaged with the first engaging structure of the rail member;

wherein the bracket comprises a disengaging structure configured to disengage the second engaging structure of the reinforcing member from the first engaging structure of the rail member.

16. The slide rail mechanism of claim 15, wherein the reinforcing member further comprises a holding part configured to support the rail member.

17. A slide rail mechanism, comprising:

a rail member;

a first supporting frame movable relative to the rail member;

a second supporting frame movable relative to the first supporting frame;

a first bracket configured to mount the slide rail mechanism to a post, the first bracket and the second supporting frame being movable relative to each other; and a reinforcing member connected to the first supporting frame, the reinforcing member comprising a holding part configured to support the rail member;

wherein the rail member comprises a first engaging structure, the reinforcing member comprises a second engaging structure, the reinforcing member is configured to be engaged with the first engaging structure through the second engaging structure;

wherein the first bracket comprises a side wall and at least one mounting member adjacent to the side wall, the slide rail mechanism further comprises a fastening member movably mounted to the first bracket;

wherein the fastening member is pivoted to the first bracket, the fastening member comprises a supporting leg, the second supporting frame comprises a supporting structure; wherein when the second supporting frame is located at a position relative to the first bracket, the supporting structure of the second supporting frame does not abut against the supporting leg of the fastening member, such that the fastening member is in a first state relative to the at least one mounting member; wherein when the second supporting frame is moved away from the position, the supporting structure of the second supporting frame abuts against the supporting leg of the fastening member, such that the fastening member is in a second state relative to the at least one mounting member;

wherein the second supporting frame further comprises an extension part and a guiding structure, the extension part is located between the supporting structure and the guiding structure, the supporting structure comprises a supporting section and a guiding section adjacent to the supporting section, the fastening member further comprises a guiding leg; when the second supporting frame is located at the position relative to the first bracket, the extension part of the second supporting frame abuts against the guiding leg of the fastening member, such that the fastening member is held in the first state; when the second supporting frame is moved away from the position relative to the first bracket, the guiding section of the supporting structure is configured to drive the supporting leg of the fastening member, such that the fastening member is moved to switch from the first state to the second state; when the fastening member is in the second state, the supporting section of the supporting structure is configured to abut against the supporting leg of the fastening member; in a process of the second supporting frame being moved back to the position relative to the first bracket, the guiding structure of the second supporting frame drives the fastening member to switch from the second state to the first state through the guiding leg.

18. A slide rail mechanism, comprising:

a rail member;

a first supporting frame movable relative to the rail member;

a second supporting frame movable relative to the first supporting frame;

a first bracket configured to mount the slide rail mechanism to a post, the first bracket and the second supporting frame being movable relative to each other; and a reinforcing member connected to the first supporting frame, the reinforcing member comprising a holding part configured to support the rail member;

wherein the rail member comprises a first engaging structure, the reinforcing member comprises a second engaging structure, the reinforcing member is configured to be engaged with the first engaging structure through the second engaging structure;

wherein the slide rail mechanism further comprises a supporting rail connected to the rail member, wherein the supporting rail comprises a upper wall, a lower wall and a longitudinal wall connected between the upper wall and the lower wall, a passage is defined by the upper wall, the lower wall and the longitudinal wall, at least one portion of the first supporting frame is movably mounted within the passage;

wherein the longitudinal wall of the supporting rail has a first limiting feature located within the passage, the first supporting frame has a second limiting feature corresponding to the first limiting feature.

\* \* \* \* \*